United States Patent
Tyhach et al.

(10) Patent No.: US 8,867,226 B2
(45) Date of Patent: Oct. 21, 2014

(54) MONOLITHIC MICROWAVE INTEGRATED CIRCUITS (MMICS) HAVING CONDUCTOR-BACKED COPLANAR WAVEGUIDES AND METHOD OF DESIGNING SUCH MMICS

(75) Inventors: Matthew C. Tyhach, Watertown, MA (US); Francois Y. Colomb, Westford, MA (US)

(73) Assignee: Raytheon Company, Waltham, MA (US)

( * ) Notice: Subject to any disclaimer, the term of this patent is extended or adjusted under 35 U.S.C. 154(b) by 94 days.

(21) Appl. No.: 13/169,521

(22) Filed: Jun. 27, 2011

(65) Prior Publication Data

US 2012/0327624 A1 Dec. 27, 2012

(51) Int. Cl.
- *H05K 1/18* (2006.01)
- *H01L 27/06* (2006.01)
- *H01Q 5/00* (2006.01)
- *H05K 1/00* (2006.01)
- *H05K 7/00* (2006.01)

(52) U.S. Cl.
CPC ........ *H01L 27/0629* (2013.01); *H01L 27/0605* (2013.01); *H01Q 5/0058* (2013.01)
USPC ............ 361/763; 361/748; 361/760; 361/761

(58) Field of Classification Search
USPC ......... 361/734, 735, 736, 738, 748, 760, 761, 361/763, 766, 799, 800
See application file for complete search history.

(56) References Cited

U.S. PATENT DOCUMENTS

| | | | |
|---|---|---|---|
| 4,587,541 A * | 5/1986 | Dalman et al. | 257/259 |
| 5,051,373 A | 9/1991 | Yamada et al. | |
| 5,760,650 A * | 6/1998 | Faulkner et al. | 330/286 |
| 5,977,631 A * | 11/1999 | Notani | 257/728 |
| 6,175,287 B1 * | 1/2001 | Lampen et al. | 333/247 |
| 2008/0116991 A1 * | 5/2008 | Gagnon et al. | 333/32 |

FOREIGN PATENT DOCUMENTS

| | | |
|---|---|---|
| EP | 0 599 469 A2 | 6/1994 |
| EP | 0 599 469 A3 | 1/1995 |
| EP | 1 058 335 A2 | 12/2000 |
| EP | 1 058 335 A3 | 3/2002 |
| WO | WO 2004/112185 A1 | 12/2004 |

OTHER PUBLICATIONS

PCT Notification of Transmittal of the International Search Report dated Sep. 19, 2012, PCT/US2012/041516.

(Continued)

*Primary Examiner* — Hoa C Nguyen
*Assistant Examiner* — Binh Tran
(74) *Attorney, Agent, or Firm* — Daly, Crowley, Mofford & Durkee, LLP

(57) ABSTRACT

A MMIC having: a substrate; a plurality of active and passive electrical elements disposed on a top surface of the substrate; a plurality of coplanar waveguide transmission line sections disposed on the top surface of the substrate for electrically interconnecting the active and passive electrical elements; an electrical conductor disposed on a bottom surface of the substrate under the coplanar waveguide section. Edges of ground plane conductors of the coplanar waveguide (CPW) sections have slots therein in regions thereof connected to the active and passive devices. The design of such circuit includes mathematical models of the CPW with the pair of local ground planes and the strip conductor thereof have relatively narrow connectable ports.

14 Claims, 5 Drawing Sheets

(56) References Cited

OTHER PUBLICATIONS

PCT Written Opinion of the International Searching Authority dated Sep. 19, 2012, PCT/US2012/041516.

S. Koch, L. Kallfass, A. Leuther, M. Schlechtweg, S. Saito, M. Uno, A Four-Antenna Transceiver MIMIC for 60 Ghz Wireless Multimedia Applications. Oct. 2008, Proceedings of the 3$^{rd}$ European Microwave Integrated Circuits Conference, Freiburg, Germany, Oct. 2008, pp. 502-505.

Paul M. Watson, Kuldip C. Gupta, fellow IEEE, Design and Optimization of CPW Circuits Using EM-ANN Models for CPW Components, IEEE, vol. 45, No. 12, Dec. 1997, pp. 2515-2523.

PCT/US2012/041516 International Preliminary Report on Patentability dated Jan. 7, 2014, 1 page.

PCT/US2012/041516.Written Opinion of the International Searching Authority dated Jan. 7, 2014, 9 pages.

\* cited by examiner

MONOLITHIC MICROWAVE INTEGRATED CIRCUITS (MMICS) HAVING CONDUCTOR-BACKED COPLANAR WAVEGUIDES AND METHOD OF DESIGNING SUCH MMICS

STATEMENT REGARDING FEDERALLY SPONSORED RESEARCH

This invention was made with Government support under Contract No. FA8650-09-C-5404 awarded by the Department of the Air Force. The Government has certain rights in this invention.

TECHNICAL FIELD

This disclosure relates generally to monolithic microwave integrated circuits (MMICs) having conductor-backed coplanar waveguides and method of designing such MMICs.

BACKGROUND AND SUMMARY

As is known in the art, many Monolithic Microwave Integrated Circuit (MMIC) structures use Coplanar Waveguide (CPW) to interconnect various electrical devices and elements of the circuit. The CPW has both the strip conductor and the adjacent ground plane conductors on the same side of a substrate where the electrical devices and elements of the circuit are formed. These ground plane conductors provide the local ground plane for the circuit. The backside of the MMIC substrates provided with a metal, such as thick electro-plated gold, to enable a thermal conductive bond between the metal and an underlying heat sink structure and also serves as an RF signal ground for the MMIC. When fed with an RF source, the RF source is connected between the strip conductor and the backside metal. The local ground planes (i.e., the CPW ground planes, sometimes referred to herein as local ground plane conductors or local grounds) are electrically connected to the backside signal ground.

As is also known in the art, Silicon Carbide (SiC) has typically been used for substrates with Gallium Nitride (GaN) MMICs. These (SiC) substrates typically have a thickness of about 500 microns. However, the use of diamond substrates has been more recently considered. These diamond substrates are inherently thinner with thickness of typically 100 microns or less.

In the case where substrate vias are not used such as with Silicon Carbide (SiC) or diamond, the space for connection between the CPW local ground and the backside signal ground is limited and sometimes the connections may be available only at the edges of the chip. Thus, there may be a physical connection between the local ground and the signal ground at only a few locations such as the RF input and output of the chip, and the DC bias and power supply connections. With such limitation, the local ground on the substrate frontside and the signal ground plane on the backside of the chip form an electrical network that supports parallel plate mode propagation. The parallel plate mode generates unwanted resonances and other deleterious electromagnetic coupling effects that affect electrical performance of the MMIC. The degree to which circuit performance is impacted depends on the thickness of the substrate and other factors such as overall chip dimensions relative to wavelength. MMICs with thinner substrates are more strongly affected as the proximity of the backside metallization favors more coupling between the CPW mode and the parallel plate mode. Whereas CPW MMICs on 500 um thick SiC substrates are only moderately affected by the backside metallization, the effect is much stronger with the thinner substrates such as 100 um thick diamond. The impact of the thinner substrate on CPW tuning must be taken into account.

Some of the prior work with CPW tuning simply neglects the impact of the backside ground due to the electrically thick SiC substrate. In other cases, effects brought about by the backside metallization such as parallel plate mode resonances, are dealt with after the fact by adding mode suppression resistors using a cut and trial procedure. Others try to moderate the impact of the backside ground metallization during the design by restricting the size of a CPW transmission line so that the widths and gaps are less than ⅓ of the substrate height. This practice can be adequate for thick 500 um substrates, but it is impractical for 100 um thick substrates because it imposes too many restrictions on the range of dimensions available for design. The corresponding lines would be too narrow and add significant loss to a CPW tuning network, degrading MMIC performance. There is published research that documents the impact of the backside ground on CPW lines with a thin substrate; see for example "Transmission Characteristics of Finite-Width Conductor-Backed Coplanar Waveguide" by Ching-Cheng Tien et al, IEEE Transactions on Microwave Theory and Techniques, vol. 41, No. 9, pp. 1616-1624, September 1993.

As is also known in the art, during the design of a MMIC, computer simulations are made to iteratively evaluate the design. One simulation software is called "Advanced Design System (ADS)" from Agilent Technologies. As is known, the software includes a library of active and passive electrical elements including transmission lines (i.e., electrical components). In such library, a typical CPW transmission line component is modeled as a two-port (i.e., input port and output port) device and the local ground planes are referenced to the RF signal ground potential; however, with such model there is no simulation of the effect of the parallel plate referred to above.

A conventional port setup for analyzing CPW circuits consist of a single port on the center conductor and an implicitly defined pair of topside current return ports. By definition the sum of the return currents is equal in magnitude and opposite in the direction of flow to the current in the center conductor. This arrangement is sometimes referred to as a push-pull port configuration. This zero-sum solution neglects any additional currents that are associated with the backside ground plane. Another common CPW approach consists of connecting the local topside CPW ground conductors to a perfectly conducting box serving as ground reference and surrounding the circuit model. This approach imposes a particular boundary condition on the fields and resulting currents, i.e. the conducing box, which in general is different than the actual environment of the circuit. In the latter case the solution of the analysis is specific to the particular configuration and generally not suitable for design purposes. Thus neither approach is capable of representing the currents of conductor backed CPW circuits accurately.

SUMMARY

In accordance with the present disclosure, a method for simulating in a digital computer coplanar waveguide section of a monolithic microwave integrated circuit comprises mathematically modeling local ground planes thereof with connectable ports, such ports being narrower than a portion of the local ground panes between the port.

In one embodiment, a monolithic microwave integrated circuit is provided having: a substrate; a plurality of active and passive electrical elements disposed on a top surface of the substrate; a plurality of coplanar waveguide transmission line sections disposed on the top surface of the substrate for electrically interconnecting the active and passive electrical elements; an electrical conductor disposed on a bottom surface of the substrate under the coplanar waveguide section. Edges of ground plane conductors of the coplanar waveguide sections have slots therein in regions thereof connected to the active and passive devices.

In one embodiment, a monolithic microwave integrated circuit is provided having: a substrate; a plurality of electrical components disposed on a top surface of the substrate and such components comprising: active and passive electrical elements and a plurality of coplanar waveguide transmission line sections for electrically interconnecting the active and passive electrical elements; an electrical conductor disposed on a bottom surface of the substrate under the coplanar waveguide section. Edges of ground plane conductors of the coplanar waveguide sections have slots disposed between the electrical components.

In one embodiment, adjacent electrical components are separated by slots in the local ground plane conductors, In one embodiment, a monolithic microwave integrated circuit is provided having: a substrate; a plurality of active and passive electrical elements disposed on a top surface of the substrate; a plurality of coplanar waveguide transmission line sections disposed on the top surface of the substrate for electrically interconnecting the active and passive electrical elements; and an electrical conductor disposed on a bottom surface of the substrate under the coplanar waveguide section. Each one of the transmission line sections includes: a pair of ground plane conductors; and a signal strip conductor disposed between the pair of ground plane conductors. Each one of the ground plane conductors includes: a first ground plane conductor port at one end thereof; a second ground plane conductor port at an opposite end thereof. A width of a portion of the ground plane conductor between the first and second ports is wider than the first and second ports.

In one embodiment, a library is provided for use in simulating in a computer a monolithic microwave integrated circuit. The library includes: a plurality of different active and passive electrical elements, including and coplanar waveguide transmission lines, tees, crosses, and capacitors. Each one of the transmission line sections comprises: a pair of ground plane conductors, each one of the ground plane conductors having: a pair of ports; and a signal strip conductor disposed between the pair of ground plane conductors, the signal strip conductor having a pair of ports. A width of a portion of the ground plane conductor between the pair of ports is wider than the pair of ground plane conductor ports.

In one embodiment, a method is provided for simulating electrical performance of a monolithic microwave integrated circuit, such microwave integrated circuit, comprising: a substrate; a plurality of active and passive electrical elements disposed on a top surface of the substrate; a plurality of coplanar waveguide transmission line sections disposed on the top surface of the substrate for electrically interconnecting the active and passive electrical elements; and an electrical conductor disposed on a bottom surface of the substrate under the coplanar waveguide section. The method includes: (A) providing a library on a storage medium of a computer, such library comprising: the plurality of different active and passive electrical elements and coplanar waveguide transmission line sections, each one of the active and passive electrical elements having a plurality of electrical ports, wherein: each one of the transmission line sections comprises: a pair of ground plane conductors, each one of the ground plane conductors having: a plurality of ports; and a signal strip conductor disposed between the pair of ground plane conductors, the signal strip conductor having a plurality of signal ports; and (B) selecting active and passive devices and transmission line sections from the library thereof to configure the monolithic microwave integrated circuit for the simulation thereof on a processor of the computer and including electrically interconnecting in the simulation the selected active and passive devices to the strip conductor and the ground plane conductors of the waveguide sections through the ground plane conductor ports and the signal conductor ports.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
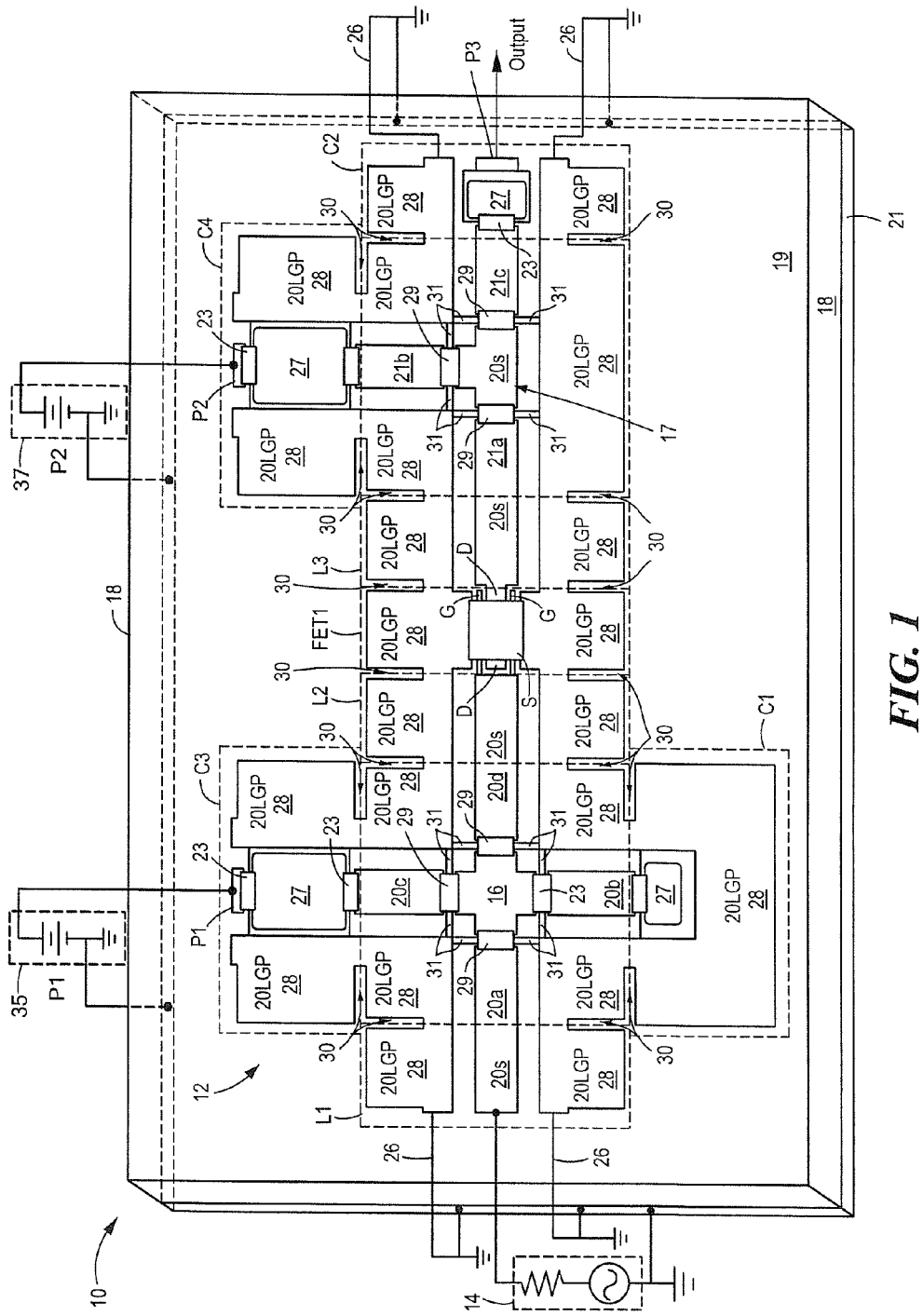
FIG. 1 is a monolithic microwave integrated circuit (MMIC) according to the disclosure.
Figure 2:
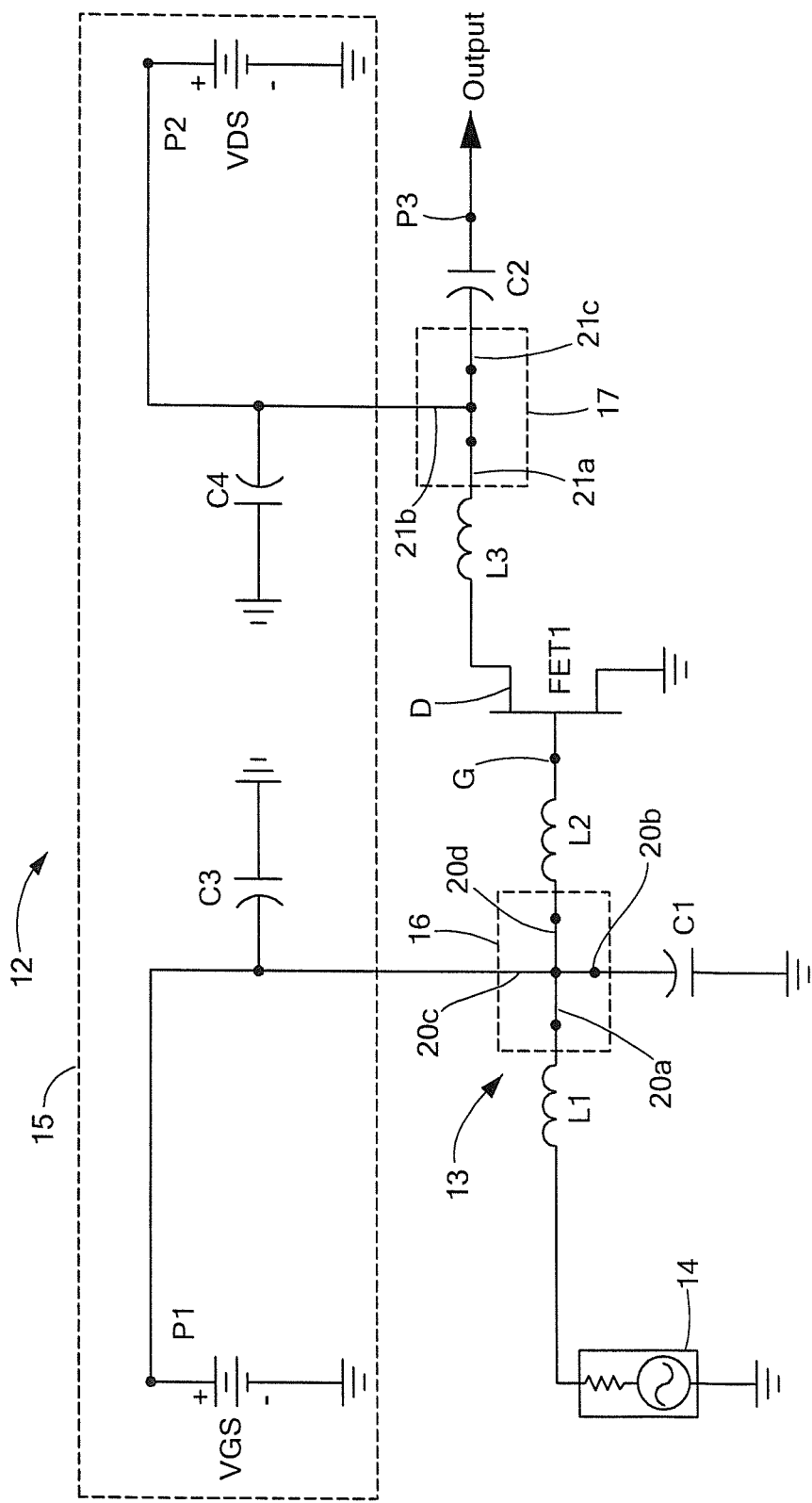
FIG. 2 is a schematic diagram of the circuit of FIG. 1.

Referring now to FIG. 1, a monolithic microwave integrated circuit (MMIC) 10 of an exemplary electrical circuit 12, here for example an amplifier represented by the simplified schematic circuit in FIG. 2, is shown. Referring to FIG. 2, here, the amplifier 12 includes a FET (FET1) having the gate electrode (G) hereof coupled to a radio frequency source 14 through a network 13 having a pair of serially coupled inductors L1, L2 and a shunt capacitor C1. One electrode of the capacitor and one electrode (here the source electrode (S)) of the FET1 are connected to ground as shown. It is noted that the inductor L1, inductor L2 and the capacitor C1 are interconnected at a cross-shaped junction 16. The output electrode, here the drain electrode (D) of the FET is coupled to an output OUTPUT through an inductor L3 and serially coupled capacitor C2, as shown.

A DC biasing network 15 is included. The DC biasing network 15 includes a gate supply VGS and a drain supply VDS. The gate supply VGS is coupled to a grounded capacitor C3 and also to the cross-shaped junction 16 connecting the inductor L1, the capacitor C1 and the inductor L2, as shown. The drain supply VDS is connected to a grounded capacitor C4 and also to a tee-shaped junction 17 connecting the inductor L3 and the capacitor C2, as shown.

Referring again to FIG. 1, the MMIC 10 includes a crystal substrate 18, here diamond, having a plurality of active and passive electrical elements formed on an upper surface 19 of the substrate 18 and a signal ground plane conductor 21, here for example electroplated gold, formed on the back surface of the substrate 18. Here, the active element is the Field Effect Transistor (FET1) and the passive elements are the capacitors (C1-C4), the inductors (L1-L3), the cross 16 and TEE 17. Here the inductors L1, L2, and L3, are formed as predetermined lengths of coplanar transmission line sections (20s, 20LGP), each one of the sections having a signal conductor 20s disposed between, and coplanar, with a pair of local ground planes 20LGPs. The cross-shaped junction 16 used to interconnect the inductor L1, inductor L2, the DC biasing circuit 15 and the capacitor C1 is formed with four coplanar waveguide transmission line sections 20a, 20b, 20c and 20d, as shown. The T-shaped junction 17 used to interconnect the inductor L3, DC biasing network 15, and capacitor C2 together are formed with three coplanar waveguide transmission line sections 21a, 21b, and 21c, as shown. The plurality of coplanar waveguide (CPW) transmission line sections 20s, 20LGP, the Tee-shaped junction 17, the cross-shaped junction 16, the active devices, here a dual gate (G) FET1, and the passive devices L1-L3 and C1-C4 are sometimes referred to herein as electrical components. The conductor 21 on the backside of the substrate 18 provides a ground for the MMIC 10 and is electrically connected to the local ground planes 20LGP of the CPW as indicated.

The capacitors C1, C2 have the top plates 27 (FIG. 1) thereof connected by conventional air bridges 23 to the signal conductors 20b and 20c and the bottom plate of capacitor C1 is connected to the adjacent local ground planes 20LGPs as indicated. The top plates of capacitors C3 and C4 are connected to contact pads P1 and P2; the bottom plate of capacitor C2 is connected to contact pad P3 as indicated. A DC gate bias source 35 is connected to contact pad P1; a DC drain supply voltage source 37 is connected to contact pad P2.

The signal conductors 20a, 20b, 20c, and 20d of the cross-shaped junction 16 and the signal conductors 21a, 21b, and 22c of the T-shaped junction 17 are interconnected by air-bridges 29. The air-bridges 29 pass over conductors 31 that are used to electrically interconnect the local ground plane conductors 20LGP, as indicated.

It is noted that outer edges 28 of local ground plane conductors 20LGP of the coplanar waveguide sections have opposing slots 30 therein in regions thereof connected to the active and passive devices. To put it another way, edges 28 of the local ground plane conductors 20LGP of the coplanar waveguide sections have opposing slots 30 therein. The opposing slots 30 are disposed between each one of the plurality of electrically connected electrical components. As will be described in more detail below, these slots 30 come about because of mathematical models used for the components in a computer simulation used in the design of the circuit 12. More particularly, the slots 30 result from the method for simulating in a digital computer the coplanar waveguide section as coplanar waveguide sections with connectable ports, to be described, such ports being narrower than a portion of the local ground planes between the ports.

Figure 3:
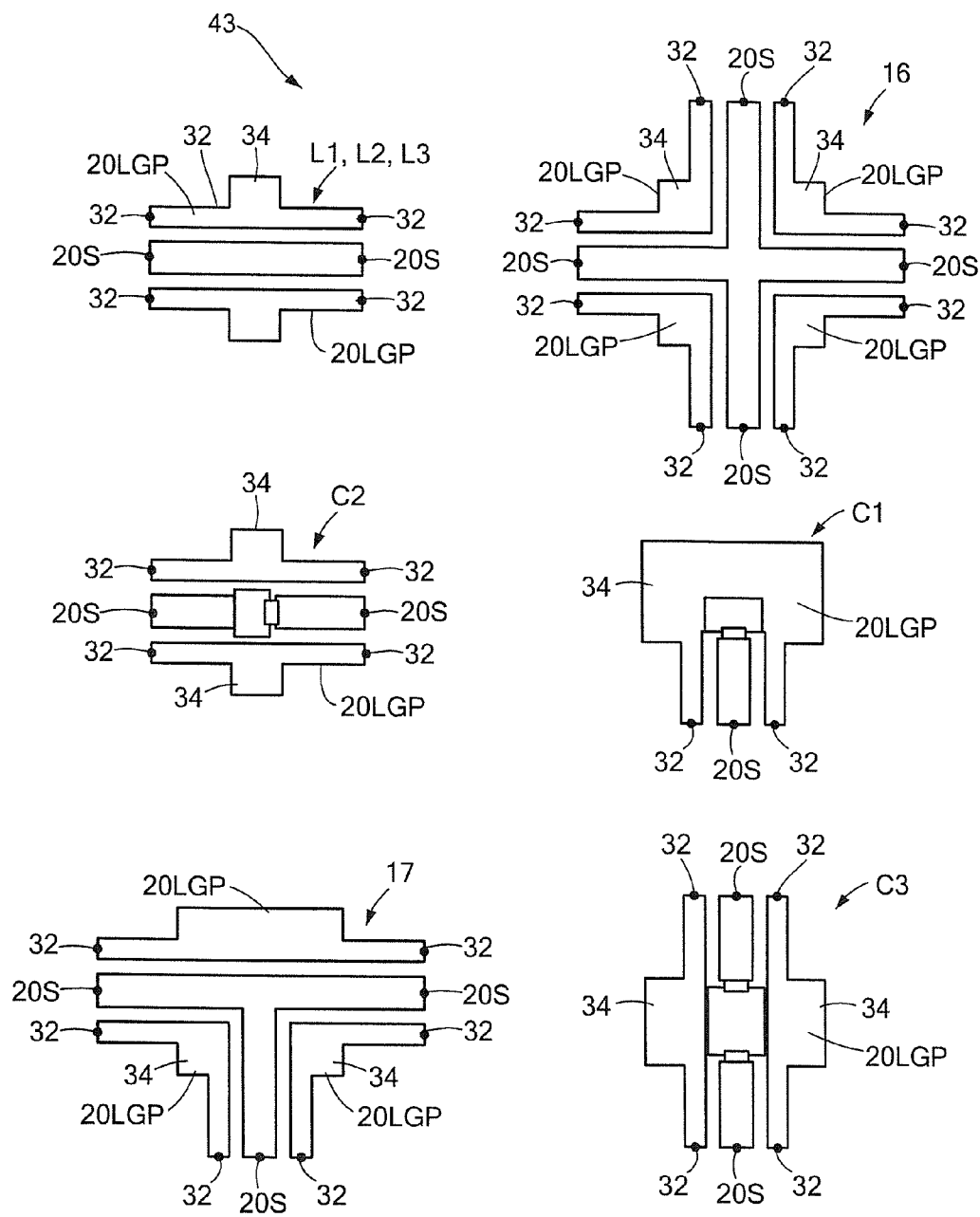
FIG. 3 is a library of components mathematically modeled to simulate the circuit of FIG. 1 during the design thereof.

More particularly, referring to FIG. 3 is a library 43 representing in the simulation models of the components used in the design simulation of the circuit 12 of FIG. 2. It is noted that in each one of the models each one of the local ground plane conductors 20 LGP of the CPW transmission line sections is mathematically modeled as having ground plane conductor ports 32 at the ends thereof. It is also noted that portions of the local ground plane conductor 20LGP between the port 30 are narrowed down in regions near and including the ports so that the currents in the local ground plane conductors are confined to conductor strips that support a single mode of transmission line propagation. This is a necessary condition for defining ports.

Figure 4:
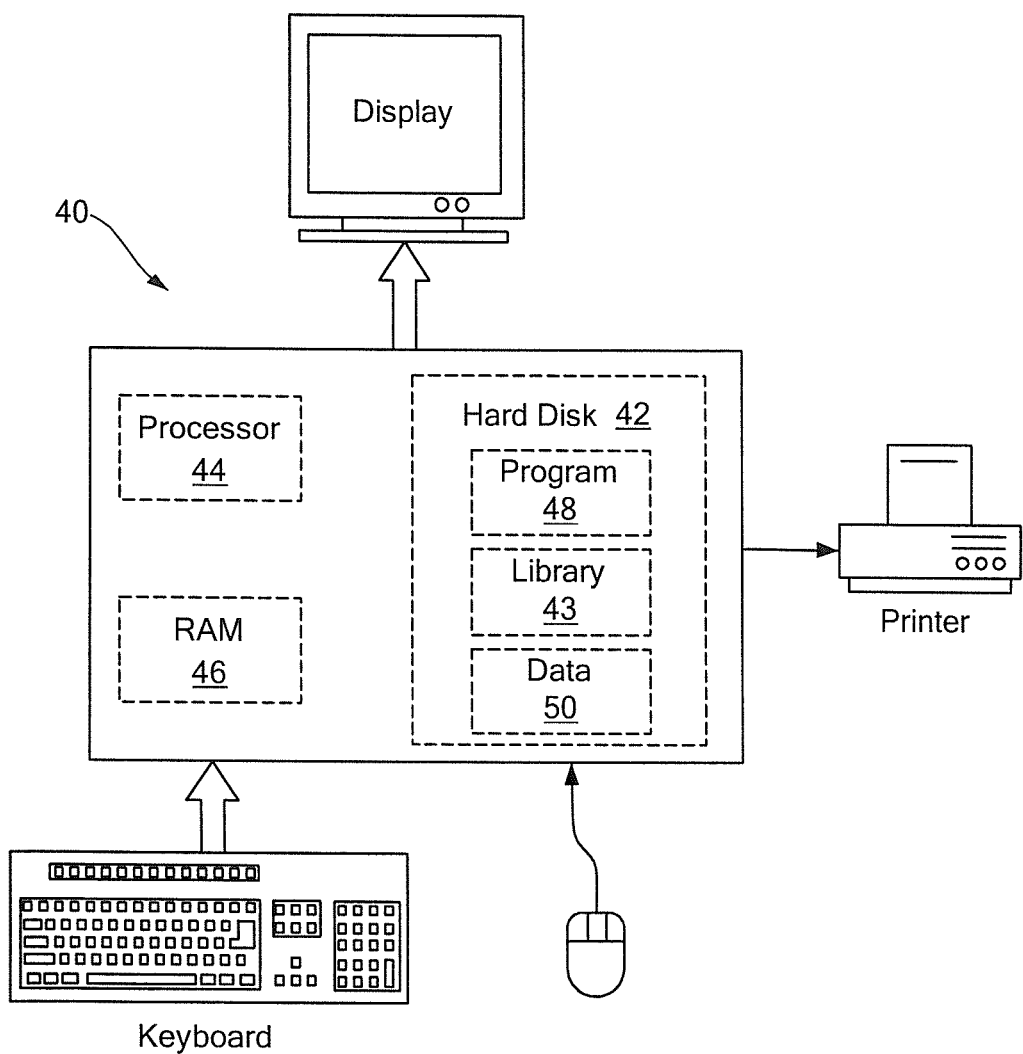
FIG. 4 is a diagram of a computer used to simulate the circuit of FIG. 1, such computer having stored the library of models of FIG. 3.

More particularly, referring to FIG. 4, a digital computer 40 is shown having a hard drive 42 included for storing a library 43 of the mathematically modeled electrical components as shown in FIG. 3, a processor 44 and random access memory 46. The hard drive 42 stores a program 48 and data 50 and is programmed to simulate a circuit being designed using selected ones of the stored electrical components stored in the library 43. Still more particularly, the library 43 is provided for use in simulating in the computer 40 a monolithic microwave integrated circuit. The library 43 includes mathematical models of a plurality of different active and passive electrical elements and coplanar waveguide transmission line sections (FIG. 3).

Thus, use of identified and modeled input and output ports in the local ground plane conductors in the mathematical models in the library allows for current from the backside ground 21 (FIG. 1) to be accounted for in the simulation and design of the CPW circuits. This is accomplished by: 1) subdividing the original circuit in a specific way; 2) forming extended sets of ports at the RF interfaces of each sub-circuit (i.e., component) to enable accurate representation of all currents in the circuit being simulated; 3) performing Electro Magnetic (EM) simulation on the sub-circuits (i.e., components (FIG. 3); and 4) connecting the results of the EM simulation together in a circuit simulation tool to obtain a model of the original full circuit.

More particularly, it is common during the design of MMICs to divide a circuit such as an amplifier, for example, into matching networks or pieces of matching networks to render the analysis and design of such circuits more manageable; each sub-circuit can be represented by its Scattering Parameters, or other equivalent representation, and is connected to its neighbor sub-circuits, or the source and load by means of ports. In conventional CPW circuits, empty areas of the circuit are typically filled with ground plane metallization. This makes the task of partitioning a circuit not straightforward since current can flow in all directions in the arbitrarily shaped ground plane and thus current does not necessarily flow exclusively parallel to the longitudinal direction of the center strip conductor at the interface between two sub-circuits. This prevents the definition of ports for EM simulation. This disclosure solves this problem by modifying the shape of the topside ground plane (i.e., the local ground plane) to enable the creation of properly defined input and output ports. Specifically, the outer edges of the coplanar ground conductors are brought in closer to create a short section of uniform CPW transmission line forming the input and output ports thereby forcing the local ground plane currents to flow parallel to the direction of the transmission line's propagation mode.

Thus, it is noted that each component has at the input and output thereof three ports; two for the local ground planes and one for the center conductor between the local ground planes. All three ports share a common ground reference provided by the substrate backside metallization conductor 21 (FIG. 1). Each component is analyzed with EM simulation. Next, these additional ground ports link together the sub-circuits that form an entire amplifier. The improved modeling accuracy of the currents in conductor backed CPW components carries over to the amplifier level by connecting the corresponding ports of the sub-circuits together. By doing so, the impact of the substrate backside metallization 21 in a CPW MMIC can be properly captured and accounted for in the design process.

Figure 5:
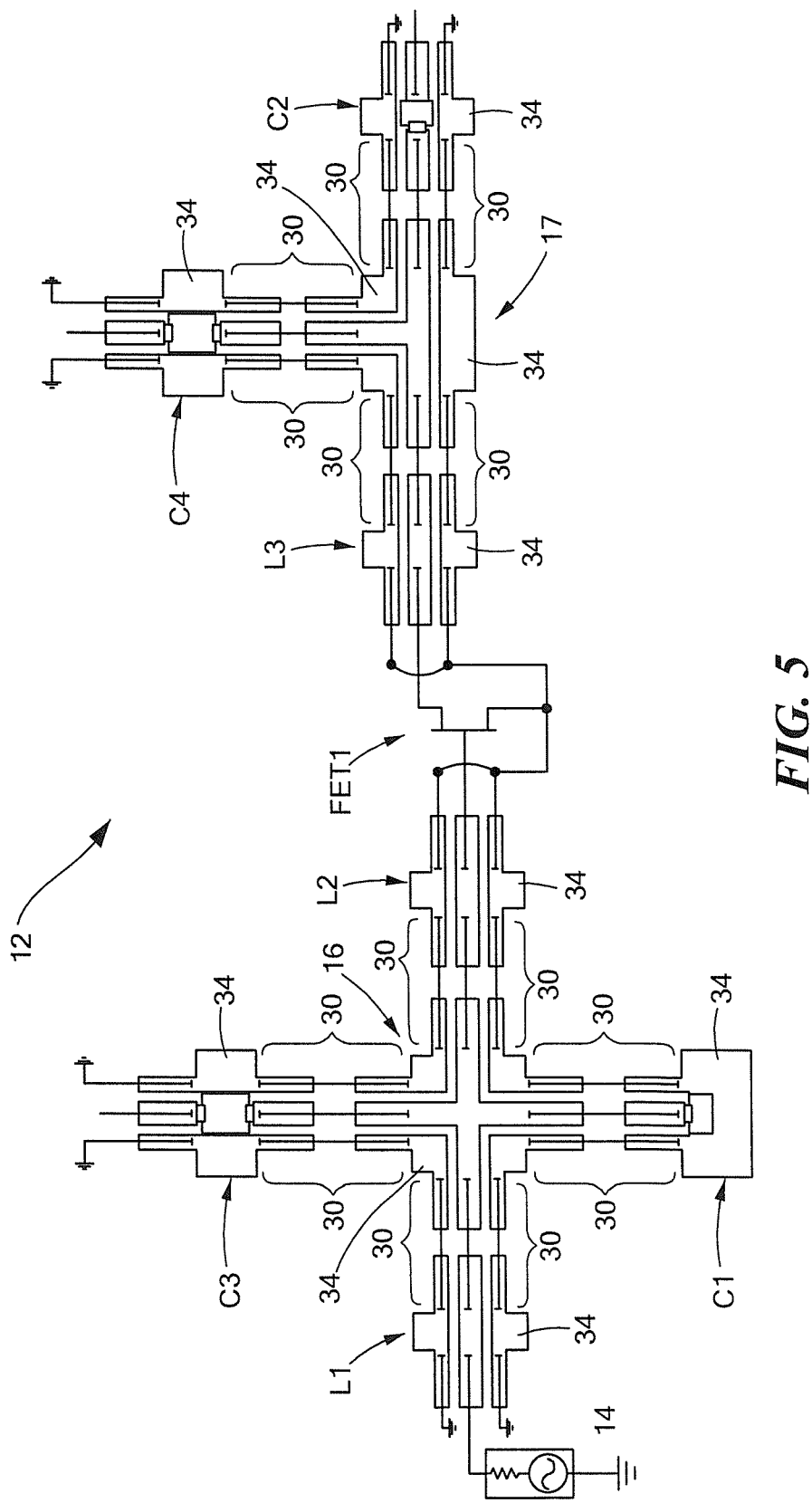
FIG. 5 is a schematic diagram of the circuit being simulated in the computer of FIG. 4 using the models of FIG. 3.

FIG. 5 is a schematic diagram of the simulated circuit 12. The S-parameters are joined in a Microwave Engineering simulator such as the above-mentioned Agilent ADS. The specific locations where expanded sets of ports are inserted correspond to logical places of partitioning a MMIC into sub-circuits for analysis and design. Preferably, this should occur on a uniform section of transmission line with a single mode of propagation. It is noted that connecting a narrow port of the local ground planes of one component to the narrow port of the next components produces a pair of opposing slots 30 in the local ground plane portion between the connected components, as shown in FIG. 1. Note that the slots 30 are foiled between the adjacent edges of the wider sections 34 of the local ground plane conductors 20LGPs as illustrated in FIGS. 1 and 5.

The method of analysis of conductor-backed coplanar waveguide circuits comprising the following steps: Partitioning of the a circuit into sub-circuits (i.e., components); Adding to the sub-circuits extended sets of defined input/output ports with each component having more than one port per RF interface; Simulating the sub-circuits with an EM simulation tool; Combining the results of the simulation of the sub-circuits with a circuit simulation tool; Simulating the full circuit. Each extended set of ports consists of a port for the center conductor, a port for one of the coplanar ground conductors, and a port for the other coplanar ground conductor. Said ports have a common ground reference at the substrate backside metallization.

In a variant of the method, each extended set of ports comprises a port for the center conductor and a common mode port for the pair of CPW ground conductors; common mode port meaning a port connecting the ends of several physically separated conductors at a common node and thus a common voltage. The ports have a common ground reference at the substrate backside metallization. Thus, the following features should be noted: A port configuration comprising two ports for conductor-backed CPW circuits; the first port being connected to the center conductor 2S; the second port being connected to the pair of coplanar ground conductors 20LGP tied together in the simulation; and both ports having a common ground reference determined by the backside metallization 21. A port configuration comprising three ports for conductor-backed CPW circuits; each conductor of the CPW being given a separate port; and all three ports having a common ground reference determined by the backside metallization. Shaping of the coplanar local ground planes to form short sections of uniform multi-conductor transmission line ports between portions of a larger circuit. This allows the designer to divide a large circuit into smaller sub-circuits and add the aforementioned ports to include in the simulation all modes supported by the conductor-backed CPW sub-circuit. The results of the sub-circuit simulations can be combined in a circuit simulation to predict the performance of the original larger circuit. The disclosure does not by itself eliminate the parallel plate mode. Rather it provides an enhanced modeling methodology for including parallel plate modes in the analysis and design of conductor-backed CPW MMICs. The MMIC designer can then proceed with the confidence that the representation of the MMIC is accurate.

A number of embodiments of the disclosure have been described. Nevertheless, it will be understood that various modifications may be made without departing from the spirit and scope of the disclosure. For example, other circuits may be designed. Accordingly, other embodiments are within the scope of the following claims.

What is claimed is:

1. A monolithic microwave integrated circuit, comprising:
a substrate;
a plurality of electrical elements disposed on a top surface of the substrate;
wherein each one of the elements having a coplanar waveguide section, each coplanar waveguide section having a strip conductor disposed between a pair of ground plane conductors, each one of the pair of ground plane conductors having two portions, a first portion being wider than a second portion, the second portion providing a ground plane conductor port for the corresponding one of the plurality of elements, the plurality of coplanar waveguide transmission line sections being disposed on the top surface of the substrate wherein the ground plane conductor port of one of the elements is directly connected to the ground plane conductor port of a connected one of the plurality of elements.

2. The structure recited in claim 1 including an electrically conductive region disposed over portions of a bottom surface of the substrate.

3. The structure recited in claim 2 wherein the electrically conductive region is a ground.

4. The structure recited in claim 1 wherein a bottom surface of the substrate is electrically conductive.

5. The structure recited in claim 4 wherein a bottom surface of the substrate is an electrical ground.

6. The monolithic microwave integrated circuit recited in claim 1 wherein a slot is formed by the ground plane conductor port of one of the elements being directly connected to the ground plane conductor port of a connected one of the plurality of elements.

7. A monolithic microwave integrated circuit, comprising:
a substrate;
a plurality of electrical elements disposed on a top surface of the substrate, each one of the elements having a coplanar waveguide transmission line section disposed on the top surface of the substrate for electrically interconnecting the electrical elements; and
wherein each one of the plurality of coplanar waveguide transmission line sections includes:
a pair of ground plane conductors; and
a signal strip conductor disposed between the pair of ground plane conductors; and
wherein each one of the ground plane conductors includes:
an input ground plane conductor port at one end thereof;
an output ground plane conductor port at an opposite end thereof;
wherein a width of a portion of the ground plane conductor between the ports is wider than the input ground plane conductor port and the output ground plane conductor port; and
wherein edges of ground plane conductors of the plurality of coplanar waveguide transmission line sections have pairs of opposing slots therein, each one of the slots in each one of the pairs projecting inwardly along a common direction parallel to the top surface towards another one of the slots in such one of the pairs, each one of the slots in such one of the pairs extending from an outer edge of one of the ground plane conductors and terminating in inner region of such one of the ground plane conductors, the slots being in regions connecting a first one of the plurality of coplanar waveguide transmission line sections to a second directly connected one of the coplanar waveguide transmission line sections.

8. A monolithic microwave integrated circuit, comprising:
a substrate;
a plurality of electrical components disposed on a top surface of the substrate;
each one of the electrical components having a coplanar waveguide transmission line section for electrically interconnecting the electrical elements; and
wherein edges of ground plane conductors of the plurality of coplanar waveguide transmission line sections have pairs of opposing slots therein, each one of the slots in each one of the pairs projecting inwardly along a common direction parallel to the top surface towards another one of the slots in such one of the pairs, each one of the slots in such one of the pairs extending from an outer edge of one of the ground plane conductors and terminating in inner region of such one of the ground plane conductors, the slots being in regions connecting one of the plurality of coplanar waveguide transmission line sections to a directly connected second one of the coplanar waveguide sections.

9. A monolithic microwave integrated circuit, comprising:
a substrate;
a plurality of electrical components disposed on a top surface of the substrate;
each one of the electrical components having:
a signal conductor; and
a pair of local ground plane conductor regions, the signal conductor being disposed between the pair of local ground plane conductor regions;
wherein each one of the pair of local ground plane conductor regions has a pair of outer local ground plane conductor ports, the local ground plane conductor ports being connected to a wider region of the local ground plane conductor regions;
wherein the local ground plane conductor port of each of the pair of local ground plane conductor regions and the signal conductor of one of the electrical components are connected directly to the local ground plane conductor port of each of the pair of local ground plane conductor regions and the signal conductor, respectively, of a connected one of the electrical components..

10. The structure recited in claim 9 including an electrically conductive region disposed over portions of a bottom surface of the substrate.

11. The structure recited in claim 10 wherein the electrically conductive region is a ground.

12. The structure recited in claim 9 wherein a bottom surface of the substrate is electrically conductive.

13. The structure recited in claim 12 wherein a bottom surface of the substrate is an electrical ground.

14. A monolithic microwave integrated circuit, comprising:
a substrate;
a plurality of electrical components disposed on a top surface of the substrate;
each one of the electrical components having:
a signal conductor having an input; and
a pair of local ground plane conductor regions, the signal conductor being disposed between the pair of the local ground plane conductor regions;
wherein pair of the local ground plane conductor regions have a pair of outer local ground plane conductor ports, the local ground plane conductor ports being connected to wider regions of the local ground plane conductor sections;
wherein one of the pair of local ground plane conductor ports of each one of the pair of local ground plane conductors is an input local ground plane conductor port and the other one of the pair of local ground plane conductor ports of each one of the pair of local ground plane conductors is an output local ground plane conductor port;
wherein the input local ground plane conductor port of each of the pair of local ground plane conductors and the input port of the signal conductor of one of the electrical components are connected to the output local ground plane conductor port of each of the pair of local ground plane conductors and the output port of the signal conductor, respectively of a connected one of the electrical components.

* * * * *